United States Patent
Hsieh et al.

(10) Patent No.: US 9,640,490 B2
(45) Date of Patent: *May 2, 2017

(54) THROUGH SILICON VIA KEEP OUT ZONE FORMATION METHOD AND SYSTEM

(71) Applicant: Taiwan Semiconductor Manufacturing Company, Ltd., Hsin-Chu (TW)

(72) Inventors: Cheng-Chieh Hsieh, Tainan County (TW); Hung-An Teng, Taoyuan (TW); Shang-Yun Hou, Jubei (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/733,401

(22) Filed: Jun. 8, 2015

(65) Prior Publication Data

US 2015/0270230 A1    Sep. 24, 2015

Related U.S. Application Data

(60) Continuation of application No. 14/057,951, filed on Oct. 18, 2013, now Pat. No. 9,054,166, which is a division of application No. 13/302,653, filed on Nov. 22, 2011, now Pat. No. 8,604,619.

(60) Provisional application No. 61/529,389, filed on Aug. 31, 2011.

(51) Int. Cl.
  *H01L 23/00*   (2006.01)
  *H01L 21/768*  (2006.01)
  *H01L 23/48*   (2006.01)

(52) U.S. Cl.
  CPC ...... *H01L 23/562* (2013.01); *H01L 21/76898* (2013.01); *H01L 23/481* (2013.01); *H01L 2924/0002* (2013.01)

(58) Field of Classification Search
  CPC ................. H01L 23/562; H01L 23/481; H01L 21/76898; H01L 2924/0002
  See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |

(Continued)

*Primary Examiner* — Minh-Loan Tran
*Assistant Examiner* — Farid Khan
(74) *Attorney, Agent, or Firm* — Slater Matsil, LLP

(57) ABSTRACT

Keep out zones (KOZ) are formed for a through silicon via (TSV). A device can be placed outside a first KOZ of a TSV determined by a first performance threshold so that a stress impact caused by the TSV to the device is less than a first performance threshold while the first KOZ contains only those points at which a stress impact caused by the TSV is larger than or equal to the first performance threshold. A second KOZ for the TSV can be similarly formed by a second performance threshold. A plurality of TSVs can be placed in a direction that the KOZ of the TSV has smallest radius to a center of the TSV, which may be in a crystal orientation [010] or [100]. A plurality of TSV stress plug can be formed at the boundary of the overall KOZ of the plurality of TSVs.

20 Claims, 6 Drawing Sheets

(56) References Cited

U.S. PATENT DOCUMENTS

| | | | |
|---|---|---|---|
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 9,054,166 B2 * | 6/2015 | Hsieh | H01L 21/76898 |
| 2010/0171226 A1 * | 7/2010 | West | H01L 23/481 257/774 |
| 2011/0169140 A1 * | 7/2011 | Moroz | H01L 21/76898 257/621 |
| 2011/0186990 A1 * | 8/2011 | Mawatari | H01L 23/3677 257/737 |
| 2011/0233785 A1 * | 9/2011 | Koester | H01L 21/768 257/773 |
| 2012/0006467 A1 * | 1/2012 | Kawai | H01L 21/4803 156/154 |
| 2012/0181700 A1 * | 7/2012 | Bonn | H01L 23/481 257/774 |
| 2012/0199905 A1 * | 8/2012 | Nitta | H01L 29/41775 257/343 |
| 2012/0319248 A1 | 12/2012 | Rahman et al. | |
| 2012/0331435 A1 | 12/2012 | Rahman et al. | |

\* cited by examiner

THROUGH SILICON VIA KEEP OUT ZONE FORMATION METHOD AND SYSTEM

This application is a continuation application of U.S. application Ser. No. 14/057,951, now U.S. Pat. No. 9,054,166, entitled "Through Silicon Via Keep Out Zone Formation Method and System," filed on Oct. 18, 2013, which application is a divisional application of U.S. application Ser. No. 13/302,653, entitled "Through Silicon Via Keep Out Zone Formation Method and System," filed on Nov. 22, 2011, which claims the benefit of U.S. Provisional Application No. 61/529,389, filed on Aug. 31, 2011, entitled "TSV Stress Plug and Methods of Forming Same," which applications are hereby incorporated herein by reference in its entirety.

BACKGROUND

Since the invention of the integrated circuit (IC), the semiconductor industry has experienced rapid growth due to continuous improvements in the integration density of a variety of electronic components. For the most part, this improvement in integration density has come from repeated reductions in minimum feature size, which allows more components to be integrated into a given area. As the demand for even smaller electronic devices has grown, there has grown a need for smaller and more creative packaging techniques of semiconductor dies.

Through Silicon Via (TSV) provides communication links for chips in vertical direction to facilitate increased level of integration in packaging and it can be used in three-dimensional integrated circuit (3D IC). Three-dimensional integrated circuits (3DICs) may be formed by stacking two dies together, with TSVs formed in one of the dies to connect the other die to a package substrate. Generally, TSVs are formed in a semiconductor wafer by initially forming an opening partially through a substrate, and filling the opening with a conductive material, such as copper. TSVs are much larger than other standard cells in a design, and thus impact IC performance in a greater degree.

Devices in the vicinity of TSVs suffer serious performance degradation due to the stress induced by the TSVs. To minimize such performance variation, a Keep-Out Zone (KOZ) is imposed around a TSV where no other devices can be placed within a KOZ. The higher the KOZ is, the lower the silicon area utilization is.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present disclosure are discussed in details below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the invention.

Figure 1A:
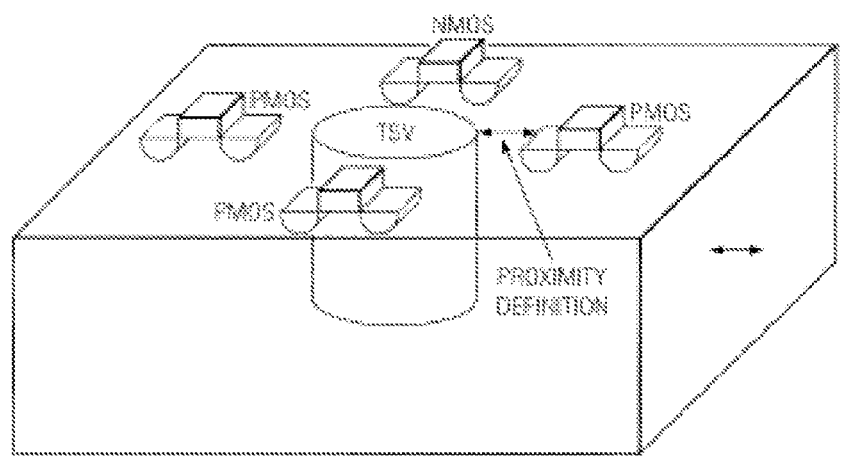
FIGS. 1(a)-1(d) illustrate various Keep Out Zones (KOZ) of a TSV.

FIG. 1(a) illustrates a TSV within a wafer in a 3-dimensional view. In the center of the wafer shown in FIG. 1(a) is a TSV. Various devices such as n-type transistors (NMOS) or p-type transistors (PMOS) or devices are placed around the TSV, with a distance defined by a Keep-Out Zone (KOZ) where no other devices can be placed around the TSV within the KOZ. The number of devices of NMOS and PMOS transistors is only shown as examples. There may be other type of active devices such as bipolar junction transistors. There may be different number of devices placed around the TSV. The size of the TSV shown is only for illustration purposes and is not limiting. A normal TSV size may range from 5 um to 120 um. A TSV could be of other sizes.

A TSV is formed by aligning, defining, and etching a cavity in a wafer; lining the sidewalls of the cavity with an insulator; and filling the cavity with metal such as copper filler or doped polysilicon to complete the connection. A TSV can be a fine TSV of a small size, or a super-TSV of a large size. A super TSV may go through substrate and metal stack, while a small TSV can be placed anywhere inside a chip. The TSV may be used in a 3D IC. The TSV may be used in other situations as well.

Due to the inherent mismatch in Coefficient of Thermal Expansion (CTE) between the metal such as copper filler and the silicon surrounding a TSV, stress develops in the vicinity of the TSV when the system undergoes a temperature change, such as cooling down from the copper annealing temperature to the room temperature. Such stress has a significant impact on the device performance. TSVs impact the device placement around the TSVs and impose a KOZ around the TSV.

Figure 1B:
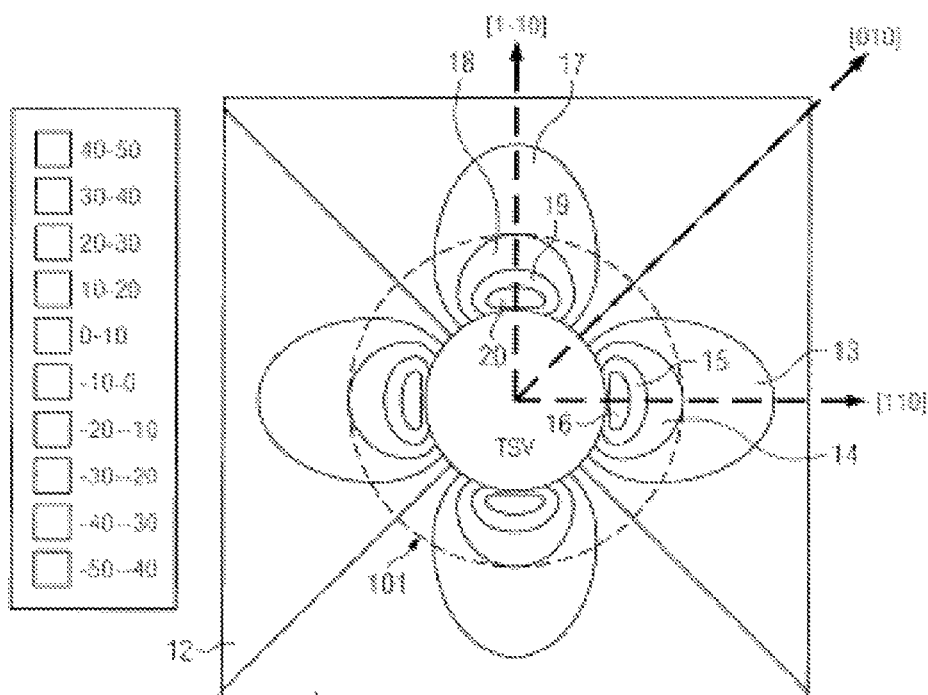
Figure 1C:
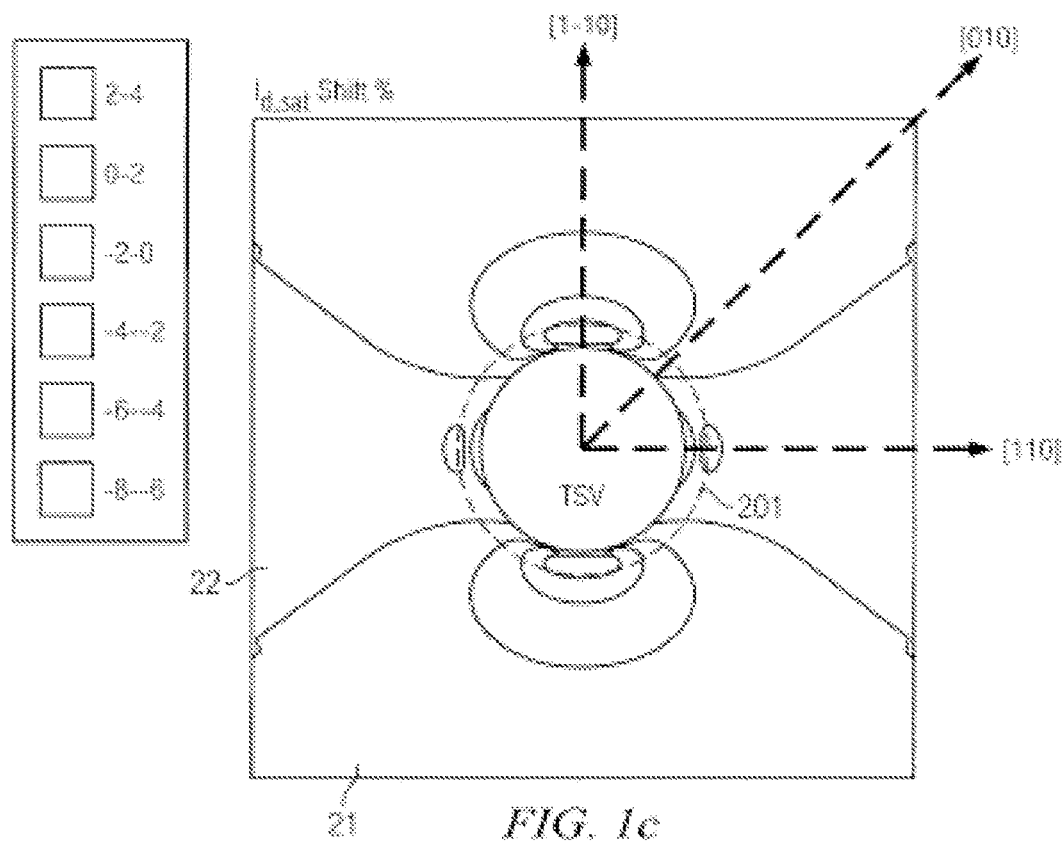

FIGS. 1(b)-1(c) illustrate more details of the KOZ around a TSV formed based on the local stress contour around a copper-filled TSV after annealing using 2-D scanning micro-Raman spectroscopy. The dotted circles 101 and 201 surrounding the TSVs shown in FIGS. 1(b)-1(c) show the conventional KOZ for a PMOS and a NMOS device respectively. The KOZ is conventionally defined as a circle centered at the center of the TSV, and having a radius equal to the largest distance (over all angular positions) from the center of the TSV. Examples of so defined KOZ for P-channel transistors may extend to a distance from the TSV which ranges from about 0.5 microns to about 5 microns, depending on the doping level of the silicon and the radius of the TSV. For N-channel transistors the KOZ may extend to a distance from the TSV which ranges from about 1 micron to about 1.5 microns.

For CMOS processes, which typically include both P-channel and N-channel transistors in close proximity to each other, the KOZ radius for the more sensitive P-channel transistors defines the KOZ for all transistors in the conventional way. Therefore, the smallest conventional KOZ for CMOS may be a circle centered at the center of the TSV and extending away from the TSV boundary defined by the performance of PMOS transistors. KOZ defined by the conventional way tends to lead to large KOZ area, failing to take into consideration of the difference of KOZs for PMOS and NMOS, and failing to take into consideration of the performance difference for a device around a TSV along various crystal orientations.

FIGS. 1(b)-1(c) illustrate that the stress induced by a TSV in the surrounding area has a strong dependency on the crystal orientation of the wafer. Various numbers, shapes, and shadows are used to mark areas showing similar stress impact measured by a performance metric such as the device drain current shift derived from the stress caused by the TSV, where the device can be a NMOS transistor or a PMOS transistor. The device drain current can shift upwards or downwards which are marked by various numbers, shapes, and shadows to indicate positive or negative percentage shifts. Other performance metrics instead of the device drain current shift may be used to classify the stress impact areas and similar pattern of areas can be found.

FIG. 1(b) illustrates an example of various stress zones along the crystal orientation for a single PMOS device. The areas marked by the same number share similar stress impact caused by the TSV. They are further numbered from 11 to 20. For example, the area marked as 11 has a corresponding performance change of about 0-10% as shown in FIG. 1(b). A large areas marked by 11 and 12 have minor performance impact as shown in FIG. 1(b). For [110]-oriented PMOS devices, the drain current shift is most severe along the [110] and [-110] axes where the areas 13-16 are centered, where the in-plane normal stresses are the dominating stress components. It is also found that the shift in the [-110] direction is slightly higher than that in the [110] direction. On the other hand, the impact decays in the off-axis area as a consequence of the decrease in the magnitude of the in-plane normal stresses. The minimum occurs in the direction close to [100]/[010] axis. The impact to NMOS devices follows the similar trend as shown in FIG. 1(c), but in a much smaller magnitude. For a NMOS device illustrated in FIG. 1(c), the area marked as 21 and 22 have small impact and it largely covers the surroundings of the TSV except in the [1-10] direction.

For the embodiment illustrated in FIG. 1(a) with stress impact areas shown in FIGS. 1(b) and 1(c), a KOZ may be defined by an area that has a similar stress impact measured by a performance threshold, instead of a circle centered with the center of TSV. A KOZ may not be a circle around a TSV. For example, if an impact of 10% is used as a performance threshold to determine a KOZ, then the KOZ for the PMOS transistor where no device can be placed comprises areas 13, 14, 15, and 16 in one direction, and 17, 18, 19, 20 in another direction, plus their mirror images in two remaining directions, as shown in FIG. 1(b). On the other hand, if a stress impact of 20% is used as a performance threshold to determine a KOZ, then the KOZ for the PMOS transistor where no device can be placed comprises areas 14, 15, and 16 in one direction, and 18, 19, 20 in another direction, plus their mirror images in two remaining directions, as shown in FIG. 1(b). Therefore the KOZ changes with the performance threshold used to determine the KOZ.

The so determined KOZ comprises only those areas where the stress impact to a performance metric is larger than or equal to the performance threshold used to determining the KOZ. A point is not in the KOZ if the stress impact to the performance metric in the point is not as big as the performance threshold, no matter how close the point is to the center of the TSV. For example, the area 13 in FIG. 1(b) has a stress impact in the range of -10% to -20%, and the area 17 has a stress impact in the range of 10% to 20%. If a performance threshold 10% is used to determine the KOZ, then both areas 13 and 17 are in the KOZ. On the other hand, a much larger area such as area 11 and 12 has stress impact less than the performance threshold 10% which determines the KOZ for the TSV. Therefore the area 11 in the [010] direction but within the circle 101 is not a KOZ and devices can be placed in this area. Therefore the KOZ has a smaller radius in the direction [010] compared to the KOZ radius in the direction of [110]. In this way, the KOZ determined by the performance threshold would take into consideration of the stress impact correlation with the crystal orientation and therefore reducing the KOZ for each device. KOZ determined by the performance threshold may not be a circle, and it may occupy less area than a circle.

The KOZs and various areas shown in FIGS. 1(b) and 1(c) are only for illustration purposes and are not limiting. The KOZs of the active region/transistor may depend on the diameter of the TSVs, with larger TSV resulting to larger KOZs. Furthermore, the KOZ may depend on the chips it is contained. For example, a KOZ for digital circuits may be in the range of about ~10 um, and in the range of ~20 um for analog circuits.

Figure 1D:
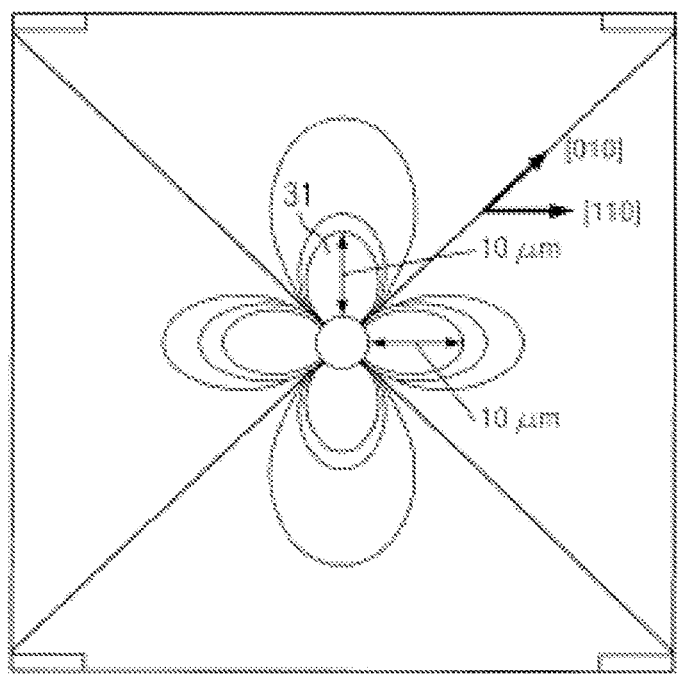

Additional KOZs can be defined for the same TSV using additional and/or device parameters such as the critical dimension (CD), or TSV Pitch (distance between the centers of two TSVs). If more than one KOZ is defined for a TSV, the overall KOZ is the joint set of the areas of all component KOZs for each parameter used. For example, the TSV illustrated in FIG. 1(d) has a KOZ comprising the area marked as 31, and its symmetric areas which are all defined by a stress impact parameter, where the area marked as 31 is determined by the performance threshold as illustrated in FIG. 1(b). The additional parameter such as the TSV pitch is less than 10 um, which applies only to a point on the direction of the next TSV is placed, can be used to define additional KOZ area. Therefore additional KOZs can be of a point in one direction as the TSV pitch distance. Those different KOZs for a TSV determined by different parameters together form the overall KOZ for the TSV.

Due to manufacturing and physical design issues, TSVs normally are not placed arbitrarily on a plane. From the aspect of manufacturing, a regular placement of TSVs improves the exposure quality of the lithographic process and therefore improves the yield. In real designs, TSVs are suggested to be placed regularly in TSV blocks which are determined in floor plan stage.

Figure 2A:
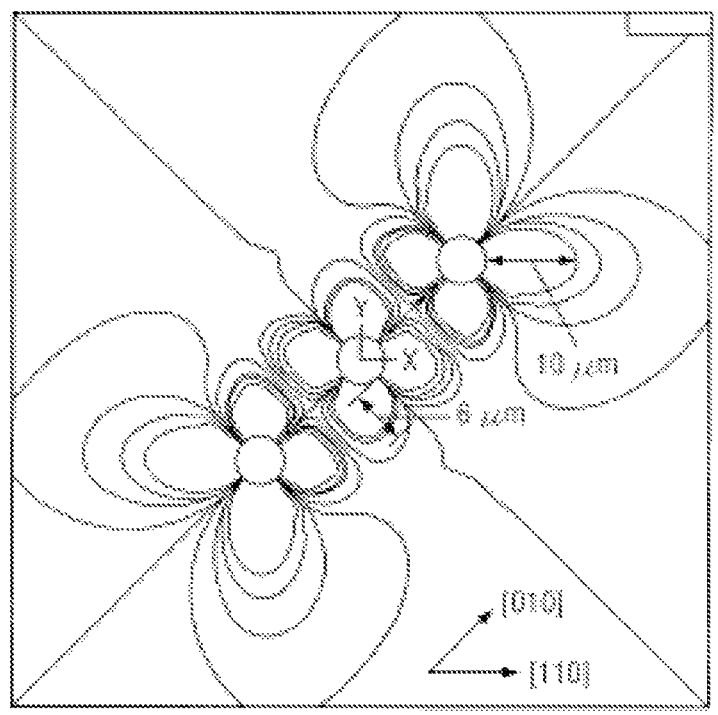
FIGS. 2(a)-2(d) illustrate example embodiments of various arrangements of a plurality of TSVs to reduce overall KOZs.
Figure 2B:
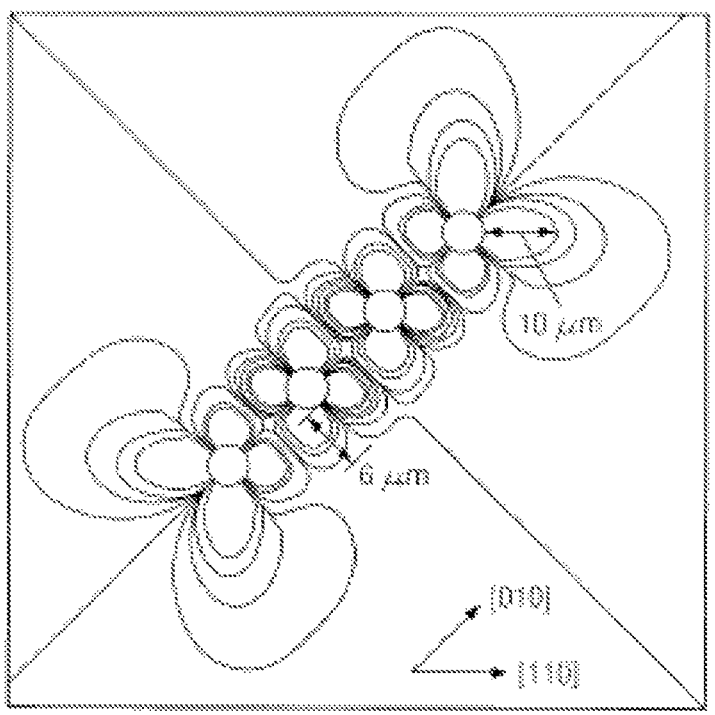

Regular placements of TSVs can take advantage of the property that stress impact to a device around a TSV shows a strong dependency on the crystal orientation of the wafer. FIGS. 2(a)-2(d) illustrate such TSV array placements. In FIG. 2(a), three TSVs are placed around the crystal orientation [010] which has the least radius of the KOZ of the TSV. Each TSV shown in FIG. 2(a) has a KOZ determined by three parameters, which are critical dimension is 6 um, pitch is 12 um, and the stress to the performance measured by the device drain current shift is less than 5%. Three TSVs are placed along the [010] direction and their overall combined KOZs for the TSV array marked by an area surrounding the center circle is the combination of the KOZ for each TSV in the TSV array. The second TSV is placed in [010] direction to the first TSV because the stress can be canceled by each other. The so obtained KOZ for the array of 3 TSVs is smaller than the TSVs being placed in other directions such as placed horizontally. The number of TSVs shown in FIG. 2(a) is only for illustrative purposes and are not limiting. Other number of TSVs can be similarly arranged. For example, four such TSVs can be arranged along the [010] direction as shown in FIG. 2(b). Two TSVs, five TSVs, or any other number of TSVs can be similarly arranged to reduce the overall KOZs.

Figure 2C:
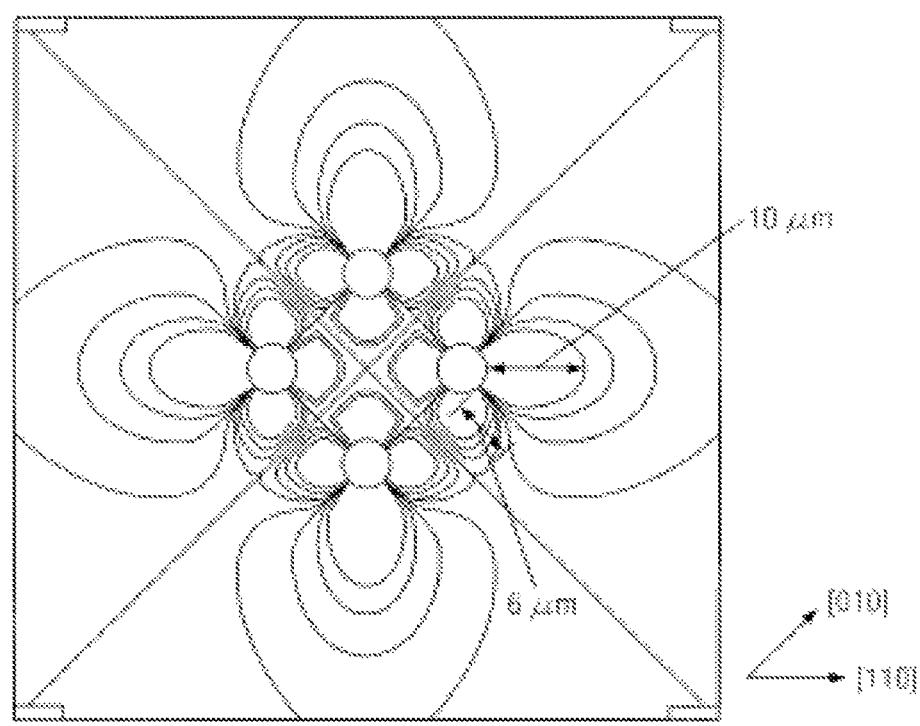
Figure 2D:
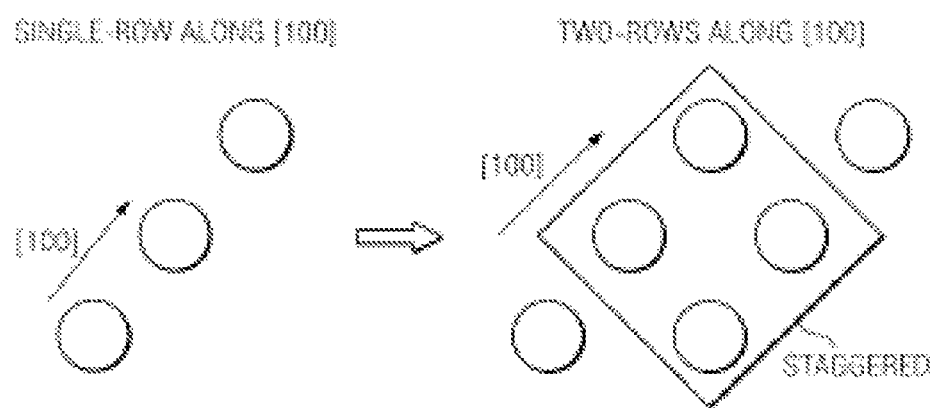

A plurality of TSVs can be arranged in other shapes taking advantages of the [010] crystal orientation, or any other directions where the KOZ has small radius and avoid placing TSVs in directions where the KOZ has a large radius. FIG. 2(c) illustrates four TSVs arranged as staggered together to form a diamond shape, along the [010] orientation. Furthermore, six TSVs are shown arranged as shown in FIG. 2(d) as a combination of staggered TSV arrangement in the center, plus two rows of [010] or [100] crystal orientations. There may be more than 6 TSVs, which can be arranged in the way illustrated in FIG. 2(d). For TSV arrays formed in FIGS. 2(c) and 2(d), the overall KOZ of the TSV array is the combination of individual KOZ for each TSV in the array, wherein an individual KOZ for a TSV may be determined by the stress impact caused by the TSV measured by a performance metric or by a plurality of performance metrics.

Figure 3A:
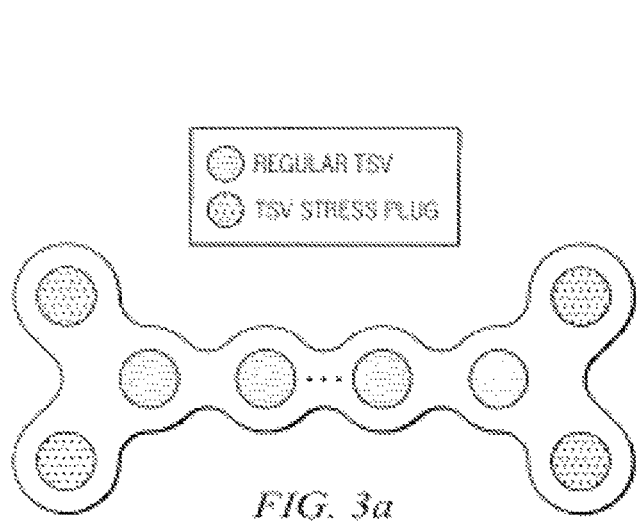
FIGS. 3(a)-3(e) illustrate embodiments of TSV stress plugs in various TSV placements.
Figure 3B:
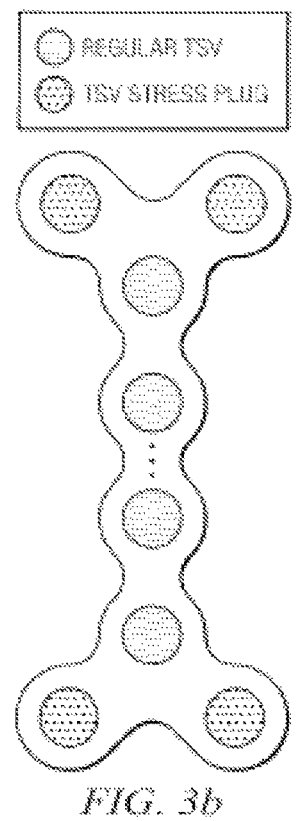
Figure 3C:
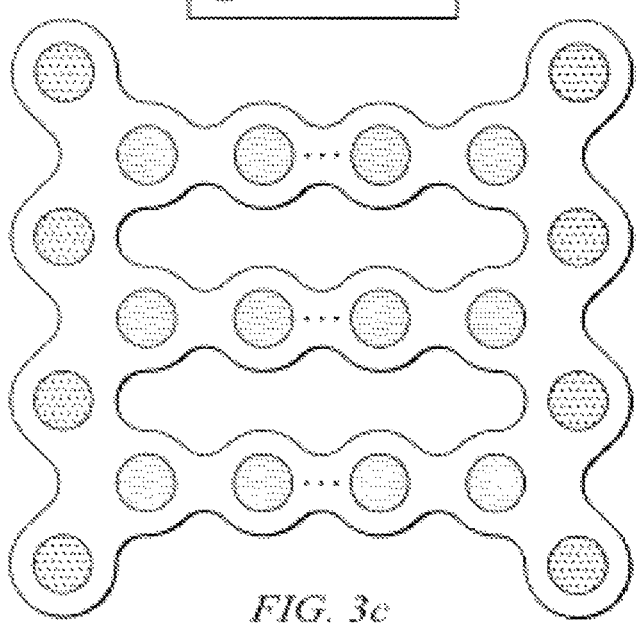

There may be situations when the arrangement of TSVs along the [010] orientation not chosen, and the TSVs are arranged in a horizontal direction or other kind of shapes such as a T-shape or a circular shape, as shown in FIGS. 3(a)-3(e). For TSV placed as shown in FIGS. 3(a)-3(e), each TSV may have its own KOZ determined individually. The joint set of KOZs around each TSV becomes the shadowed areas around the array of TSVs as shown in FIGS. 3(a)-3(c). However, for TSVs at the end of the linear TSV array, its KOZ may be determined by the method as illustrated in FIGS. 2(b)-2(d), which leads to an overall KOZ for a TSV array as shown in FIGS. 3(a)-3(c). TSV stress plugs can be placed at the end boundary area for the TSVs at the end of the TSV array, which result in placements shown in FIGS. 3(a)-3(c).

The TSV stress plug used in FIGS. 3(a)-3(e) are of similar sizes as the TSVs in the TSV array, and formed similarly in a same process as the TSVs. The difference is that TSV stress plugs are dummy TSVs. TSV stress plug are formed using similar silicon as the material around the TSV stress plug. The KOZ is reduced by TSV stress plugs because of stress cancellation, similar with the TSV array along the crystal orientation [010] shown in FIG. 2(a).

Figure 3D:
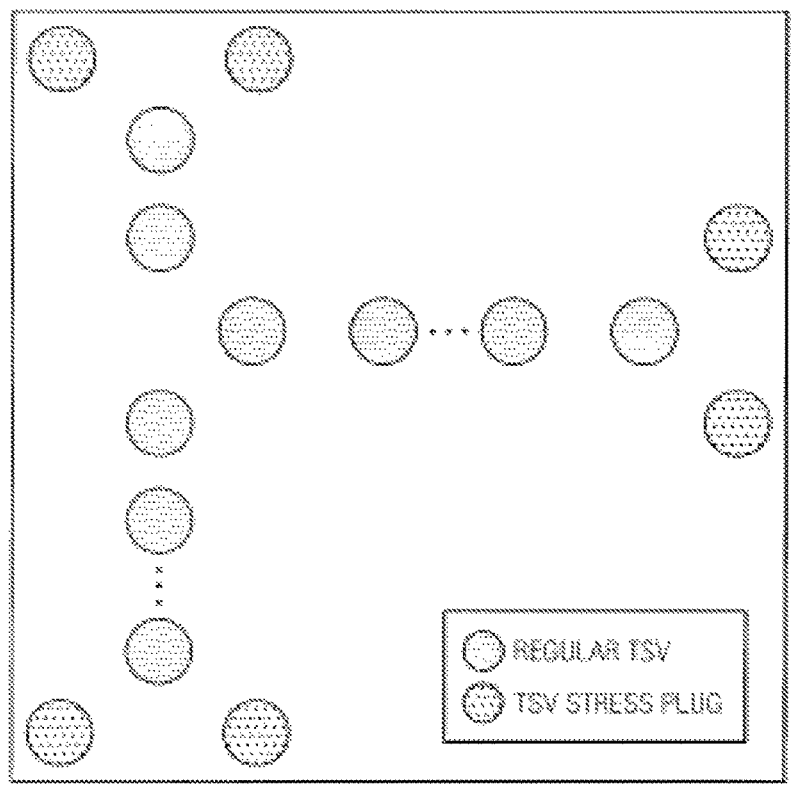
Figure 3E:
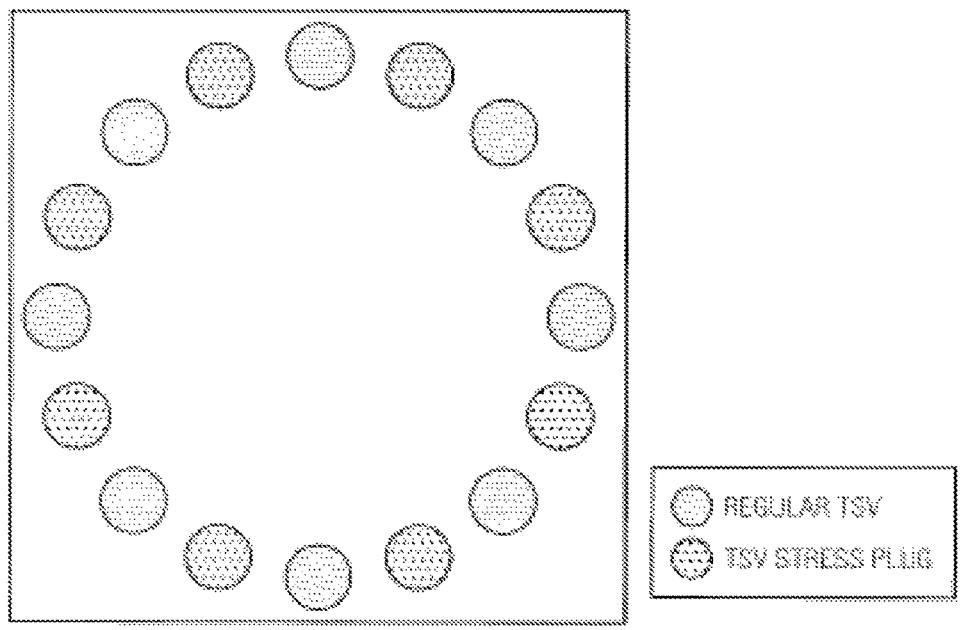

FIG. 3(a) illustrates a linear array of TSV is formed, with four TSV stress plugs positioned at the end of the array. The array is formed in horizontal direction. FIG. 3(b) illustrates a linear array of TSV is formed in vertical direction with four TSV stress plugs positioned at the end of the array. FIG. 3(c) illustrates a plurality of TSVs form multiple linear arrays, to become a grid or matrix, with combined KOZ as shown in shadowed area. FIG. 3(d) illustrates a plurality of TSVs form a T-shape array, with a plurality of TSV stress plugs positioned at the end points of the T-shaped array. Finally, FIG. 3(e) illustrates a circle of TSVs, where TSV stress plugs are positioned in an alternative position with the TSVs.

The embodiments of the present disclosure have several advantageous features. As illustrated in the above, KOZ design rule for integrated circuit devices can be reduced, thus resulting in improved silicon area utilization, by the use of TSV stress plugs and the careful arrangement of the TSV arrangement. In summary, the orthotropic elastic properties of Si is of great importance in determining the TSV KOZ and the strategy for TSV-induced stress management. The impacted area can be further minimized through a better TSV array arrangement.

In an embodiment, a method of forming an integrated circuit is provided. The method includes forming a plurality of active devices and forming a plurality of TSVs, wherein each TSV has a respective KOZ, a union of the respective KOZs defining an overall KOZ for the plurality of TSVs. The method further includes forming a one or more first TSV stress plugs at a first end region of an overall KOZ of the plurality of TSVs, the one or more first TSV stress plugs cancelling at least a portion of stress caused by the plurality of TSVs.

In another embodiment, a method of forming an integrated circuit is provided. The method includes forming a plurality of active devices and forming a plurality of TSVs, wherein each TSV has a respective KOZ, a union of the respective KOZs defining an overall KOZ for the plurality of TSVs. The method further includes forming a one or more first TSV stress plugs adjacent the plurality of TSVs within the overall KOZ, the one or more first TSV stress plugs cancelling at least a portion of stress caused by the plurality of TSVs.

In yet another embodiment, a method of forming an integrated circuit is provided. The method includes forming a plurality of active devices on a substrate and forming TSVs such that none of the plurality of active devices are positioned in an overall KOZ, the overall KOZ being a region in which a stress impact of the TSVs exceeds a threshold, a KOZ of each TSV having a first radius to a center of the respective TSV in a first crystal orientation and a second radius to the center of the respective TSV in a second crystal orientation, the first radius being smaller than the second radius. The method further includes one or more TSV stress plugs within the overall KOZ, the one or more TSV stress plugs being dummy TSVs.

Although the present disclosure and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of forming an integrated circuit (IC), the method comprising:
   forming a plurality of active devices;
   forming a plurality of through silicon vias (TSVs) arranged along a linear axis, wherein each TSV has a respective keep out zone (KOZ), a union of the respective KOZs defining an overall KOZ for the plurality of TSVs; and
   forming a first set of TSV stress plugs comprising a pair of TSV stress plugs at a first end region of an overall KOZ of the plurality of TSVs, the first set of TSV stress plugs reducing stress caused by the plurality of TSVs, the first set of TSV stress plugs being spaced equidistant from the linear axis, no TSV stress plugs being along the linear axis at the first end region.

2. The method of claim 1, further comprising forming a second set of TSV stress plugs comprising at least one TSV stress plug at a second end region of the overall KOZ of the plurality of the TSVs.

3. The method of claim 2, wherein the first end region is opposite the second end region.

4. The method of claim 1, wherein in plan view the plurality of TSVs are arranged at a first pitch in a first direction and the first set of TSV stress plugs are spaced from an end one of the plurality of TSVs in the first direction a distance less than the first pitch.

5. The method of claim 4, wherein the first set of TSV stress plugs comprise at least two stress plugs positioned on opposing sides of the linear axis.

6. The method of claim 1, wherein the plurality of TSVs are formed of a different material than the first set of TSV stress plugs.

7. The method of claim 1, wherein the plurality of TSVs are arranged in a T pattern.

8. The method of claim 7, further comprising a second set of TSV stress plugs comprising at least one TSV stress plug at a second end region of the T pattern and a third set of TSV stress plugs comprising at least one TSV stress plug at a third end region of the T pattern, wherein the first end region is another end region of the T pattern.

9. A method of forming an integrated circuit (IC), the method comprising:
 forming a plurality of active devices;
 forming a plurality of through silicon vias (TSVs), wherein each TSV has a respective keep out zone (KOZ), a union of the respective KOZs defining an overall KOZ for the plurality of TSVs; and
 forming a first set of TSV stress plugs comprising at least one TSV stress plug adjacent the plurality of TSVs and within the overall KOZ, the first set of TSV stress plugs reducing stress caused by the plurality of TSVs, wherein each of the respective KOZ has a first radius to a center of the respective TSV in a first crystal orientation and a second radius to the center of the respective TSV in a second orientation, the first radius being smaller than the second radius.

10. The method of claim 9, wherein first set of TSV stress plugs are interposed between adjacent TSVs of the plurality of TSVs.

11. The method of claim 9, wherein the plurality of TSVs are arranged in a circle, wherein the plurality of TSVs and the first set of TSV stress plugs alternate.

12. The method of claim 9, wherein in plan view none of the first set of TSV stress plugs is aligned with a line formed by connecting a center of each of two adjacent TSVs of the plurality of TSVs.

13. The method of claim 9, wherein the plurality of TSVs are arranged in a line, wherein the line is oriented in the second orientation.

14. The method of claim 9, wherein each KOZ is defined as a region wherein a stress impact caused by each respective TSV exceeds a threshold throughout the entire region.

15. The method of claim 14, wherein the threshold is a percentage of drain current shift caused by the each respective TSV.

16. The method of claim 15, wherein the threshold is a mobility change percentage caused by the each respective TSV.

17. A method of forming an integrated circuit (IC), the method comprising:
 forming a plurality of active devices on a substrate;
 forming through silicon vias (TSVs) such that none of the plurality of active devices are positioned in an overall keep out zone (KOZ), the overall KOZ being a region in which a stress impact of the TSVs exceeds a threshold, a KOZ of each TSV having a first radius to a center of the respective TSV in a first crystal orientation and a second radius to the center of the respective TSV in a second crystal orientation, the first radius being smaller than the second radius; and
 forming at least one TSV stress plug within the overall KOZ, the at least one TSV stress plug being a dummy TSV.

18. The method of claim 17, wherein at least some of the TSVs are arranged along a linear line.

19. The method of claim 18, wherein the at least one TSV stress plug is arranged at an end of the linear line of TSVs.

20. The method of claim 19, wherein the at least one TSV stress plug is formed of a different material than the TSVs.

\* \* \* \* \*